(12) United States Patent
Shiu

(10) Patent No.: US 7,943,529 B2
(45) Date of Patent: May 17, 2011

(54) PASSIVATION STRUCTURE AND FABRICATING METHOD THEREOF

(75) Inventor: Jian-Bin Shiu, Hsinchu (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 283 days.

(21) Appl. No.: 12/340,766

(22) Filed: Dec. 22, 2008

(65) Prior Publication Data

US 2010/0155908 A1 Jun. 24, 2010

(51) Int. Cl.
*H01L 21/00* (2006.01)
*H11L 29/06* (2006.01)

(52) U.S. Cl. .............. 438/761; 257/626; 257/E21.531; 257/E29.018

(58) Field of Classification Search .......... 257/635, 257/E21.602, E21.531, E29.018, 626, 632; 438/763, 17, 3, 612, 758, 761, 958
See application file for complete search history.

(56) References Cited

U.S. PATENT DOCUMENTS

2008/0036485 A1* 2/2008 Nagai ........................ 324/765

* cited by examiner

*Primary Examiner* — Thomas L Dickey
*Assistant Examiner* — Nickolay Yushin
(74) *Attorney, Agent, or Firm* — Winston Hsu; Scott Margo

(57) ABSTRACT

A passivation structure and fabricating method thereof includes providing a chip having a main die region and a scribe line region defined thereon and a plurality of metal pads respectively positioned in the main die region and the scribe line region, forming a first patterned passivation layer having a plurality of first openings and second openings respectively exposing the metal pads in the main die region and the scribe line region on the chip, and forming a second patterned passivation layer filling the first openings in the scribe line region and having a plurality of third openings corresponding to the first openings thus exposing the metal pads in the main die region.

20 Claims, 5 Drawing Sheets

PASSIVATION STRUCTURE AND FABRICATING METHOD THEREOF

BACKGROUND OF THE INVENTION

1. Field of the Invention

The invention relates to a passivation structure and a fabricating method thereof, and more particularly, to a method for fabricating the passivation structure and openings therein by two separate steps.

2. Description of the Prior Art

Manufacturing of integrated circuits includes a large number of precise and complicated processes such as semiconductor processes for forming devices on wafers; and metal interconnection processes for forming interconnection layers composed of metal layers and inter-metal dielectric (IMD) layers. These interconnection layers electrically connect nodes of the semiconductor devices, e.g. gate and source/drain, to pad layers that serve as I/O terminals disposed above the topmost interconnection layer. Normally, the pad layer is protected from water, scratches and other contamination by a passivation layer.

In some particular applications such as the finger printer, the passivation layer is required not only to provide effective protection against water, scratches and other contamination, but also to provide endurance for pressure from fingers, salinity from the environment, and electrostatic discharge (ESD). To satisfy those requirements, the prior art has rendered rigid dielectric material such as SiN to form the passivation layer. It is well-known that the mechanical strength of a layer is proportional to the cube of its thickness while the passivation layer is further required to sustain a test voltage of tens of thousands of Volts and ESD, thus the passivation layer is made much thicker in the prior art to improve its endurance to pressure, scratches, and ESD.

Please refer to FIGS. 1-2, which are cross-sectional views of a chip comprising a conventional thicker passivation layer. As shown in FIG. 1, a chip 100 having a main die region 102 and a scribe line region 104 defined thereon is provided; and the main die region 102 of the chip 100 includes a formed integrated circuit and a plurality of interconnection layers (both not shown). An IMD layer 110 is formed on the chip 100 and a plurality of metal pads 112 is formed on the IMD layer 110. The metal pads 112 positioned in the main die region 102 serve as I/O terminals while the metal pads 112 in the scribe line region 104 serve as test pads. A passivation layer 120 is then formed to cover the metal pads 112 on the chip 100, and followed by a photo-etching-process (PEP) for patterning the passivation layer 120, so that openings 122 respectively exposing the metal pads 112 in the main die region 102 and in the scribe line region 104 are formed.

Please refer to FIG. 2. Next, a passivation layer 130 which is thicker than conventional requirement in ordinary application is formed on the chip 100. Then another PEP utilizing the same mask used in the preceding PEP is performed to pattern the passivation layer 130, thus a plurality of openings 132 respectively corresponding to the openings 122 and consequently exposing the metal pad 112 are formed in the passivation layer 130. The exposed metal pads 112 are able to form metal wirings subsequently. However, it is observed that cracks always occur in the passivation layer 130 in the openings 132, particularly in corners of the openings 132. It is also observed that the cracks adversely influence endurance of the passivation layer 130 to the ESD.

Furthermore, please refer to FIG. 2 again. Conventionally, a deep trench is formed in the scribe line region 104 where no metal pads 112 are formed during patterning the passivation layer 120, thus the thickness in the scribe line region 104 is reduced and consequently prevents the main die region 102 from stress generated during the dicing. Nevertheless, a step height between the main die region 102 and the scribe line region 104 is unavoidably increased due to the formed thicker passivation layer 130. Therefore, alignment in the following process is deteriorated, and metal wirings 140 easily flow from the metal pad 112 in the main die region 102 to the openings 132 in the scribe line region 104 when forming gold bonds, bumps and even the wire bonding, and consequently cause short circuiting.

SUMMARY OF THE INVENTION

Therefore the present invention provides a passivation structure and fabricating method to prevent short circuiting and cracks from occurring.

According to the claimed invention, a method for fabricating a passivation structure is provided. The method first provides a chip having at least a main die region and a main die region defined thereon. The chip also comprises a plurality of metal pads respectively positioned in the main die region and the scribe line region. Then, a first patterned passivation layer having a plurality of first openings and second openings respectively exposing the metal pads in the main die region and scribe line region is formed on the chip. After forming the first patterned passivation layer, a second patterned passivation layer filling the second openings in the scribe line region is formed on the first patterned passivation layer. The second patterned passivation layer comprises a plurality of third openings respectively corresponding to the first openings and exposing the metal pads in the main die region.

According to the claimed invention, a passivation structure formed on a chip having a plurality of metal pads formed is provided. The passivation structure comprises a first patterned passivation layer formed on the chip while the first patterned passivation layer comprises a plurality of first round openings respectively exposing the metal pads. The passivation structure also comprises a second patterned passivation layer formed on the first patterned passivation layer. The second patterned passivation layer comprises a plurality of second round openings respectively corresponding to the first round openings.

According to the claimed invention, a passivation structure formed on a chip having at least a main die region and a scribe line region defined thereon and a plurality of metal pads respectively positioned in the main die region and the scribe line region is further provided. The passivation structure comprises a first patterned passivation layer formed on the chip, and the first patterned passivation layer includes a plurality of first openings and second openings respectively exposing the metal pads formed in the main die region and the scribe line region. The passivation structure further comprises a second patterned passivation layer filling the second openings in the scribe line region on the first patterned passivation layer. The second patterned passivation layer includes a plurality of third openings respectively corresponding to the first openings in the main die region.

According to the provided invention, the passivation structure is fabricated by forming the first patterned passivation layer and the second patterned passivation layer in two separate steps, while the formed openings in the main die region are round openings. Thus problems such as cracks occurring at corners which make the passivation structure unable to sustain the ESD are avoided. Furthermore, since the openings in the second patterned passivation layer are formed only in the main die region, therefore only the metal pads in the main die region are exposed to be I/O terminals of the integrated circuits by the corresponding openings while those openings exposing the metal pads in the scribe line region are filled by the second patterned passivation layer, therefore the overflow of the gold bonds from the main die region to the scribe line region or to the openings in the scribe line region and the generated short circuits are also prevented.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-9 are schematic drawings illustrating a method for fabricating a passivation structure according to a preferred embodiment of the present invention, wherein FIG. 3 is a sectional top view of a chip.

FIG. 4 is a cross-sectional view taken along line A-A' of FIG. 3.

FIG. 5 is a cross-sectional view in a step subsequent to FIG. 4.

FIG. 6 is a cross-sectional view in a step subsequent to FIG. 5.

FIG. 7 is a cross-sectional view take along line B-B' of FIG. 3.

FIG. 8 is a cross-sectional view in a step subsequent to FIG. 7.

FIG. 9 is a cross-sectional view in a step subsequent to FIG. 8.

DETAILED DESCRIPTION

Figure 1:
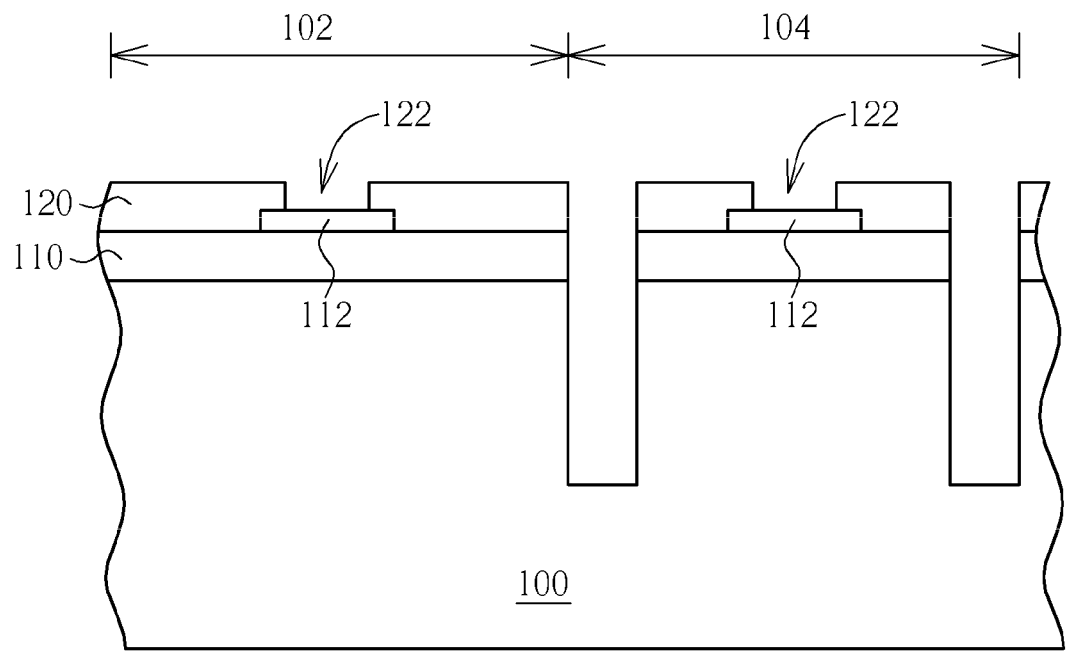
FIG. 1 is a cross-sectional view of a chip comprising a conventional thicker passivation layer.
Figure 2:
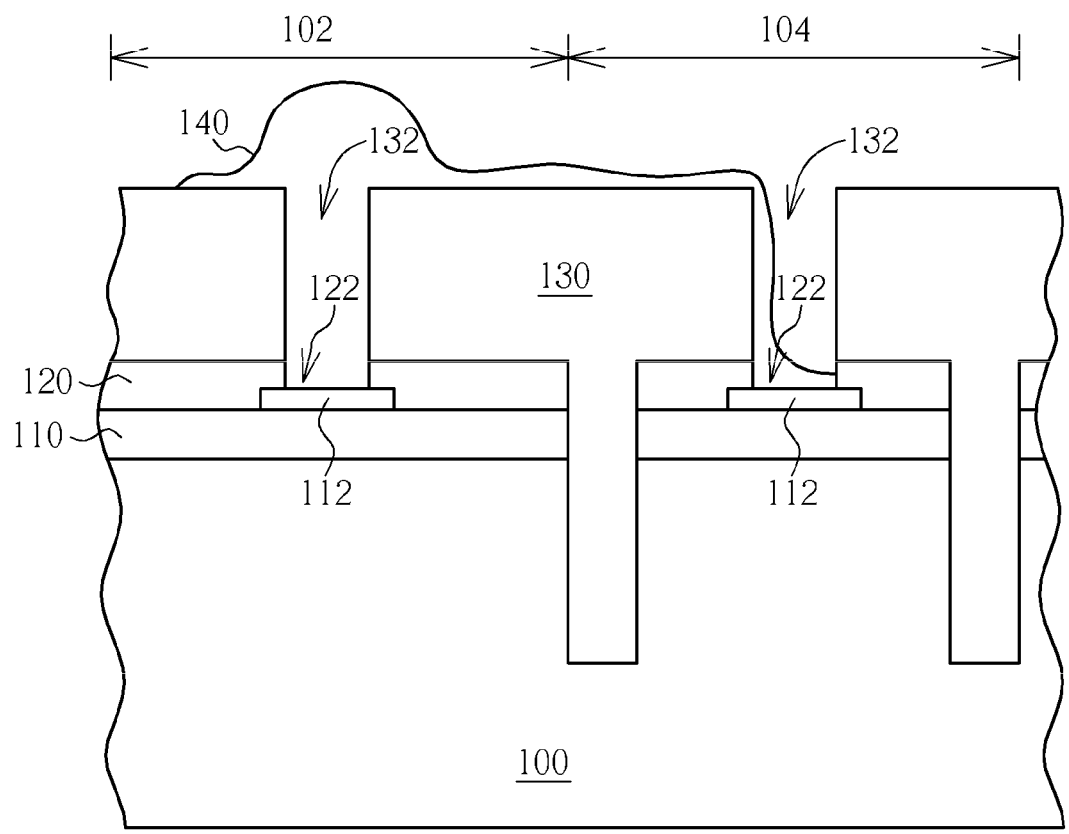
FIG. 2 is a cross-sectional view of a chip comprising a conventional thicker passivation layer in a step subsequent to FIG. 1.
Figure 3:
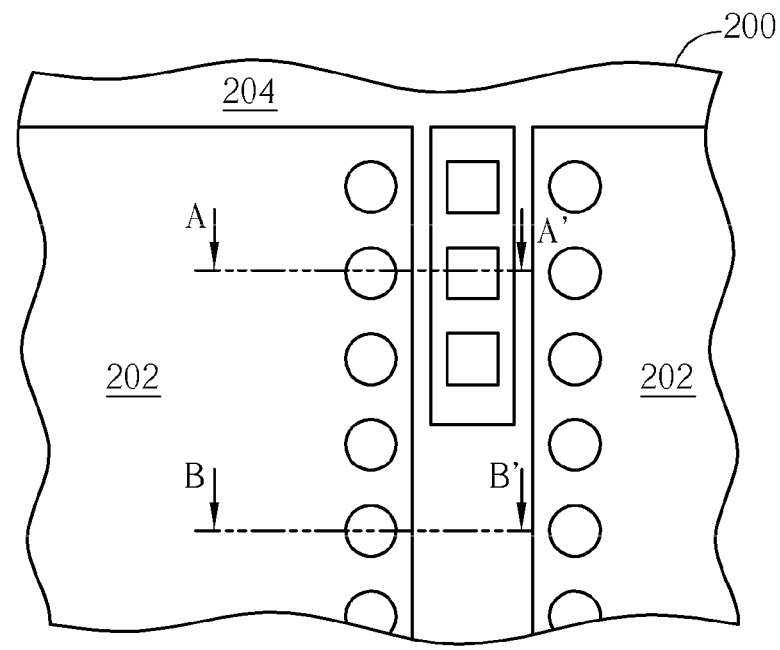
Figure 4:
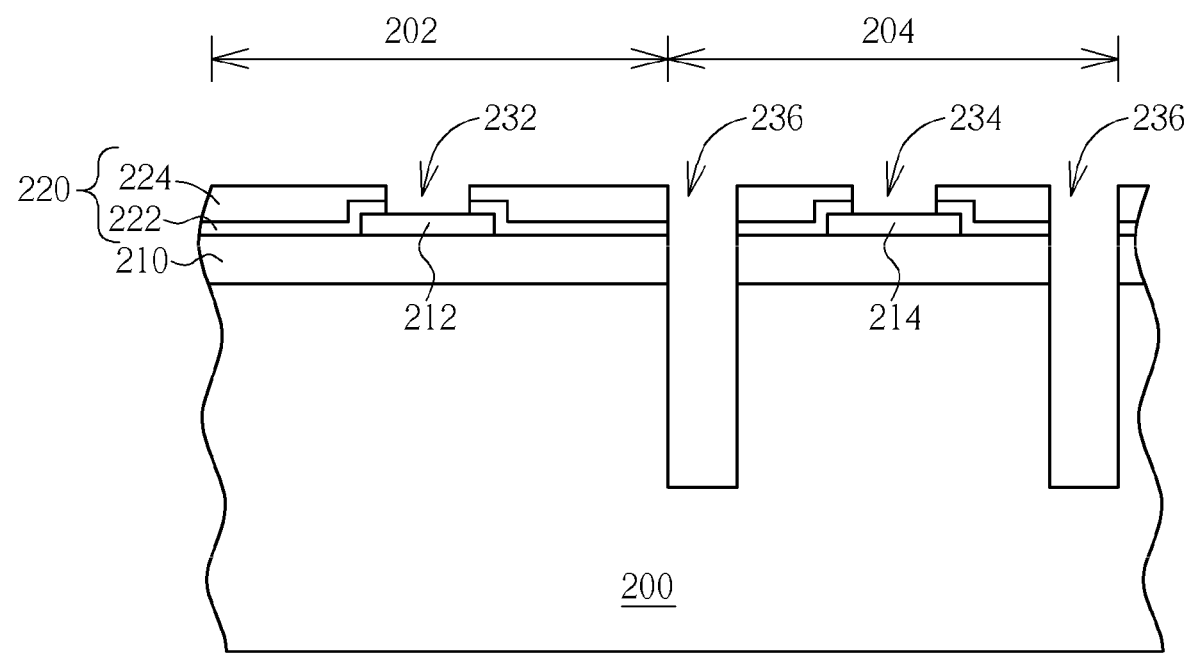
Figure 5:
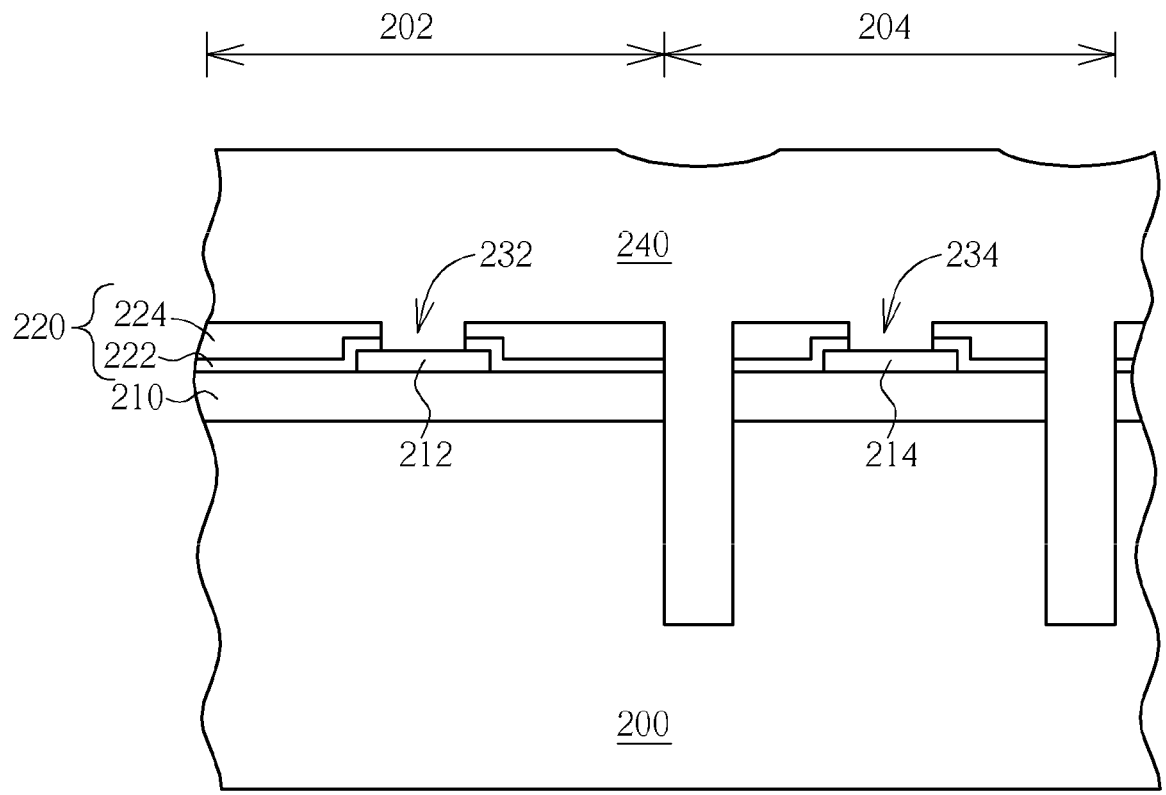
Figure 6:
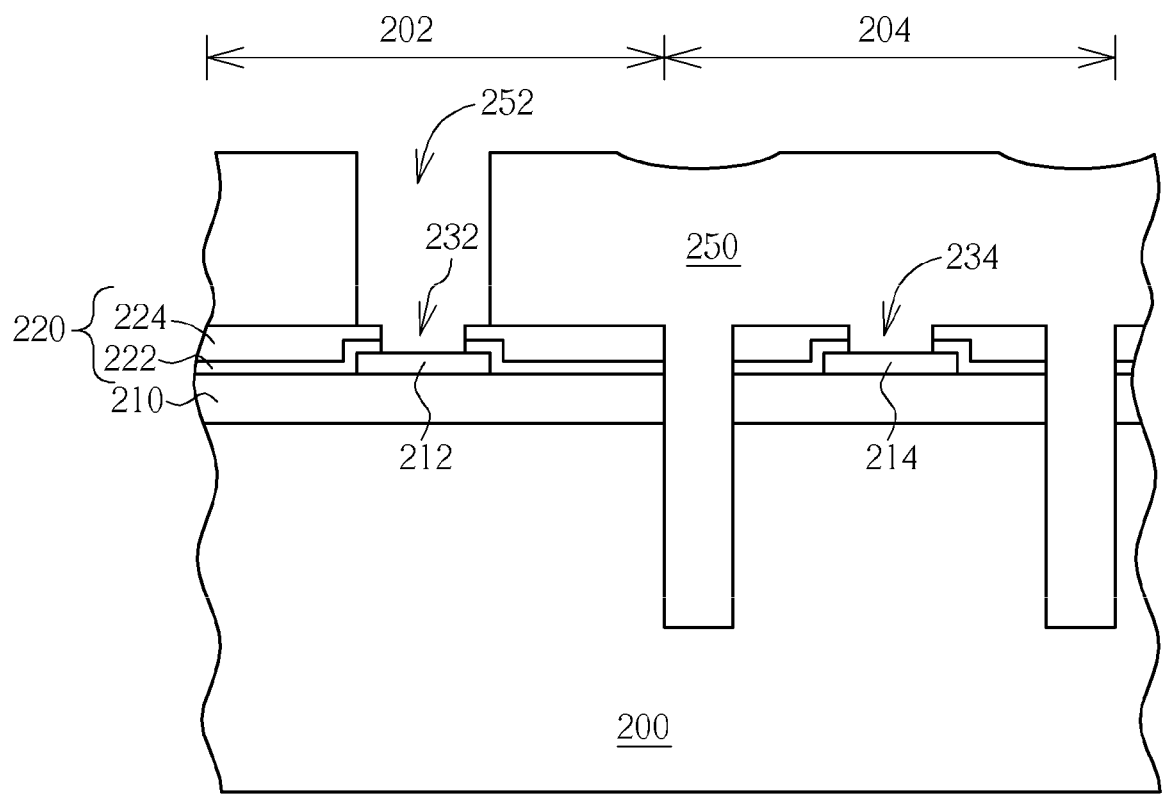

Please refer to FIGS. 3-9, which are schematic drawings illustrating a method for fabricating a passivation structure according to a preferred embodiment of the present invention: FIG. 3 is a sectional top view of a chip, FIGS. 4-6 are cross-sectional views taken along line A-A' of FIG. 3, and FIGS. 7-9 are cross-sectional views taken along line B-B' of FIG. 3. As shown in FIG. 4, a chip 200 having at least a main die region 202 and a scribe line region 204 defined thereon is provided. The chip 200 also includes a plurality of semiconductor devices and a plurality of interconnection layers (both not shown). In the interest of brevity, only the topmost IMD layer 210 is shown in FIG. 4. The IMD layer 210 is formed with a thickness about 13000 (13K) angstroms (Å). On the IMD layer 210, a plurality of metal pads 212, 214 made of aluminum or copper are respectively formed in the main die region 202 and the scribe line region 204.

Please still refer to FIG. 4. Next, a first patterned passivation layer 220 is formed on the chip 200. The first patterned passivation layer 220 is a bi-layer lamination composed of dielectric material. Said bi-layer lamination upwardly comprises a silicon oxide layer such as a tetraethylorthosilicate (TEOS) layer 222, and a silicon nitride (SiN) layer 224. A thickness of the first patterned passivation layer 220 is between 7000 Å and 13000 Å. In the preferred embodiment, a thickness of the TEOS layer 222 is about 6000 Å while a thickness of the SiN layer 224 is about 7000 Å.

Figure 7:
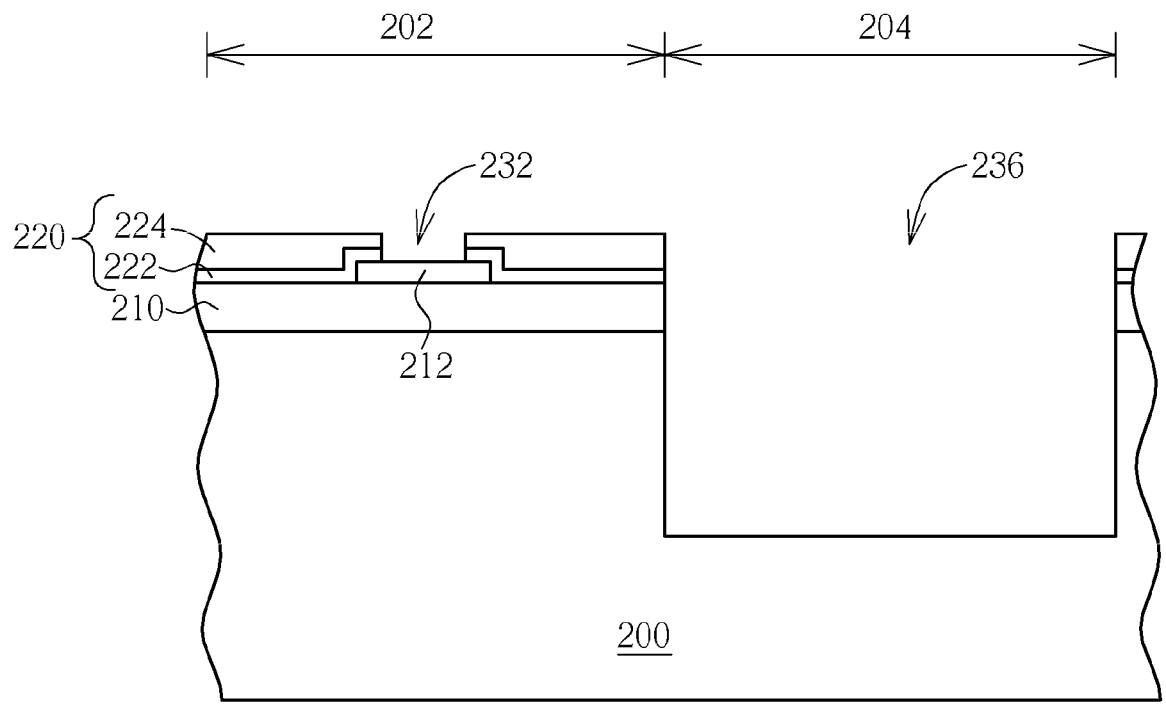

Please refer to FIG. 4 and FIG. 7. The first patterned passivation layer 220 is patterned by a first PEP, thus a plurality of first openings 232 and second openings 234 respectively exposing the metal pads 212, 214 in the main die region 202 and the scribe line region 204 are obtained after the first PEP. In the preferred embodiment, the method for fabricating the passivation structure further comprises a step of performing a test process after forming the first patterned passivation layer 220 with the metal pads 214 exposed by the second opening 234 serve as test pads in the scribe line region 204. Furthermore, as shown in FIG. 4 and FIG. 7, the passivation layer 220, the IMD layer 210 and un-shown dielectric layers underneath the IMD layer 210 in the scribe line region 204 where no metal pads 214 are formed is further etched to form a deep trench 236 around the metal pads 214 in the scribe line region 204. In addition, the first openings 232 are round openings while the second opening 234 is not limited to be round or not depending on process requirements.

Figure 8:
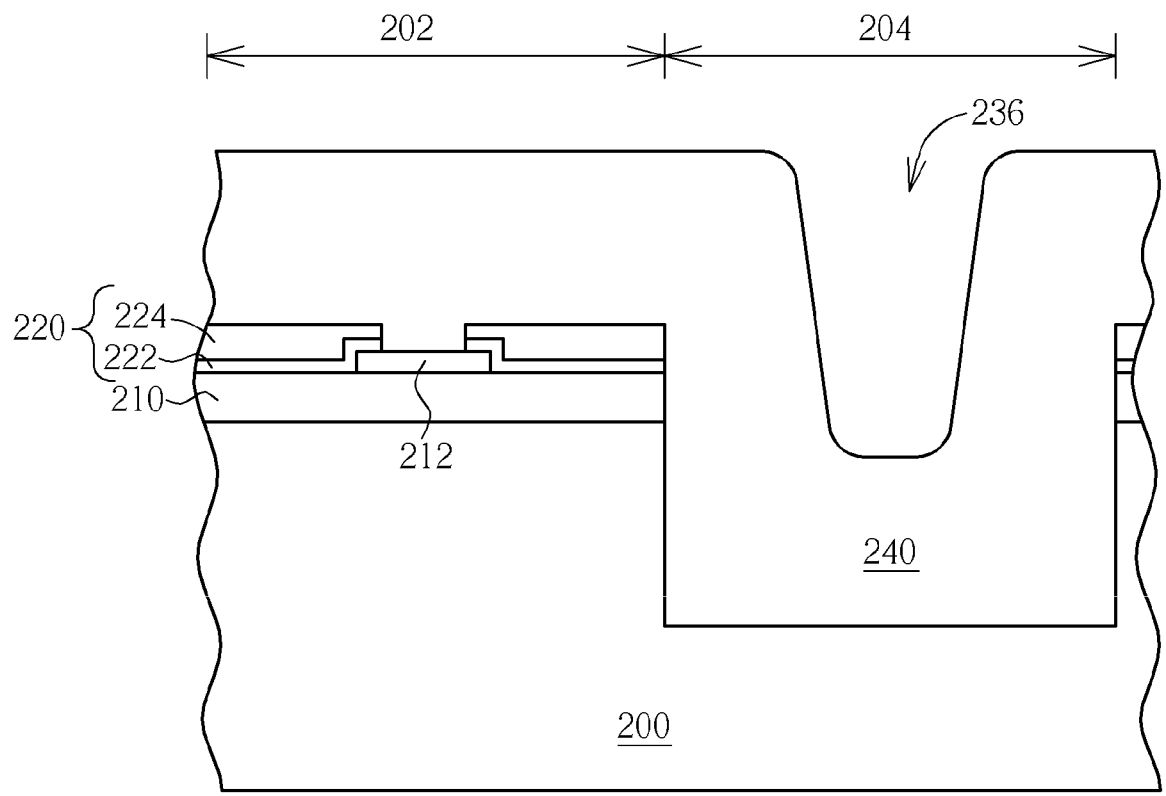

Please refer to FIG. 5 and FIG. 8. Then, a second passivation layer 240 filling the first opening 232, the second opening 234 and the deep trench 236 is formed on the first patterned passivation layer 220. In the preferred embodiment, the second passivation layer 240 comprises SiN, but it is not limited to other rigid materials such as silicon carbide, diamond-like carbon, barium titanate ($BaTiO_3$), strontium titanate ($SrTiO_3$), or tantalum oxide, etc. A thickness of the second passivation layer 240 is between 20000 Å and 150000 Å.

Figure 9:
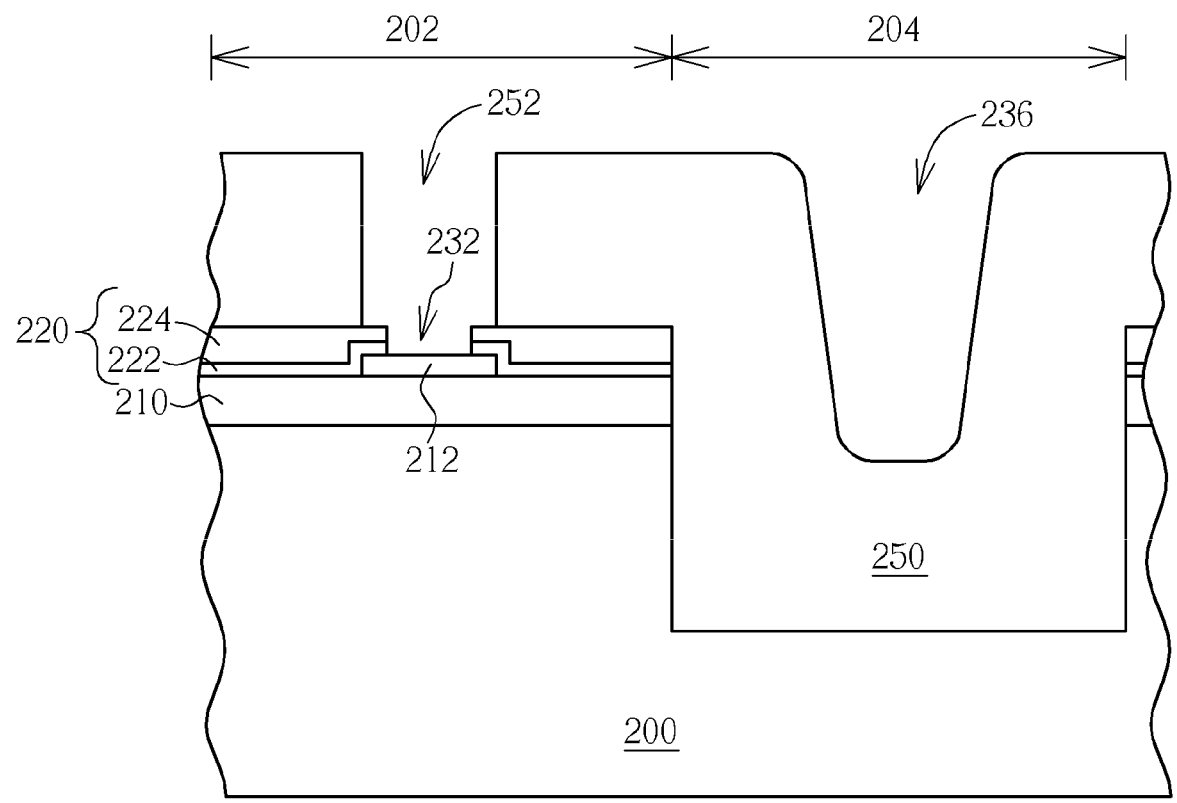

Please refer to FIG. 6 and FIG. 9. A second PEP is performed to pattern the second passivation layer 240, thus a second patterned passivation layer 250 is obtained. The second patterned passivation layer 250 comprises a plurality of third openings 252 respectively corresponding to the first openings 232 and exposing the metal pads 212 in the main die region 202. The third openings 252 are also round openings. The metal pads 212 are exposed to undergo gold bonds process, bumping, or wire bonding process, and to be I/O terminals of the integrated circuit. It is noteworthy that in the second PEP, no openings are to be formed in the scribe line region 204. In other words, the second openings 234 are completely filled and the deep trench 236 is covered by the second passivation layer 240/second patterned passivation layer 250. Accordingly, the thicker second passivation layer 240/second patterned passivation layer 250 has no influence on the step height between the main die region 202, particularly in the main die region 202 near the scribe line region 204, and the scribe line region 204. Furthermore, overflow of gold bonds, bumping, even wire bonding from the main die region 202 to the scribe line region 204, or to the openings in the scribe line region 204 which is found in the prior art and the short circuit issue are prevented.

In addition, as shown in FIG. 9, according to the method for fabricating a passivation structure provided by the present invention, the predetermined position where the deep trench 236 is to be formed in the scribe line region 204 is impervious to the first and second PEP. Therefore, the claimed method is able to provide the trench 236 to prevent the main die region 202 from being damaged during dicing.

Please refer to FIG. 3 and FIG. 6 again. According to the claimed method, a passivation structure formed on a chip 200 is provided. The passivation structure comprises a first patterned passivation layer 220 formed on the chip 200. The first patterned passivation layer 220 comprises a plurality of round openings 232 respectively exposing a plurality of metal pads 212. The passivation structure further comprises a second patterned passivation layer 250 formed on the first patterned passivation layer 220. The second patterned passivation layer 250 also comprises a plurality of round openings 252 corresponding to the round openings 232.

According to the provided passivation structure, the first patterned passivation layer 220 is a bi-layer lamination, and a thickness of the first patterned passivation layer 220 is between 7000 Å and 13000 Å. As mentioned above, the bi-layer lamination upwardly comprises a SiO layer such as TEOS layer 222, and a SiN layer 224. A thickness of the TEOS layer 222 is about 6000 Å; and a thickness of the SiN layer 224 is about 7000 Å. The second patterned passivation layer 250 comprises SiN, SiC, diamond-like carbon, $BaTiO_3$, $SrTiO_3$, or tantalum oxide, etc., and a thickness of the second patterned passivation layer 250 is between 20000 Å and 150000 Å.

It is noteworthy that according to the provided passivation structure, the openings 232, 242 are made round, therefore cracks occurring at corners of conventional openings found in the following processes are completely prevented. Additionally, openings 234 are not limited to be round or not.

Furthermore, according to the provide passivation structure, the chip 200 includes the main die region 202 and the scribe line region 204 defined thereon. The openings 232, 234 are formed in the main die region 202 for exposing the metal pads 212, so that the exposed metal pads 212 are rendered as I/O terminals after gold bond process, bumping, or wire bonding. And the openings 234 expose the metal pads 214 in the scribe line region 204 so that the metal pads 214 serve as test pads in test process. It is noteworthy that the second patterned passivation layer 240 of the passivation structure is made filling the openings 234, therefore overflow of gold bonds, bumping, even wire bonding from the main die region 202 to the scribe line region 204, or to the openings in the scribe line region 204 which is found in the prior art and the short circuit issue are prevented.

According to the provided invention, the passivation structure is formed by forming the first patterned passivation layer and the second patterned passivation layer in two separate steps, while the formed openings in the main die region are round openings. Thus problems such as cracks occurring at corners which make the passivation structure unable to sustain ESD are prevented. Furthermore, since the openings in the second patterned passivation layer are formed only in the main die region by the second PEP, only the metal pads in the main die region are exposed to be I/O terminals of the integrated circuits by the corresponding openings while those openings exposing the metal pads in the scribe line region are filled by the second patterned passivation layer, therefore the overflow of the gold bonds from the main die region to the scribe line region or the openings in the scribe line region and the generated short circuits are also prevented.

Those skilled in the art will readily observe that numerous modifications and alterations of the device and method may be made while retaining the teachings of the invention.

What is claimed is:

1. A method for fabricating a passivation structure comprising steps of:
   providing a chip having at least a main die region and a scribe line region defined thereon, the main die region and the scribe line region respectively comprising a plurality metal pads formed therein;
   forming a first patterned passivation layer on the chip, the first patterned passivation layer comprising a plurality of first openings and second openings exposing the metal pads respectively formed in the main die region and the scribe line region; and
   forming a second patterned passivation layer filling the second openings in the scribe line region on the first patterned passivation layer, the second patterned passivation layer comprising a plurality of third openings respectively corresponding to the first opening and exposing the metal pads in the main die region.

2. The method of claim 1, wherein the metal pads exposed in the second openings in the scribe line region serve as test pads.

3. The method of claim 2 further comprising a step of performing a test process after forming the first patterned passivation layer.

4. The method of claim 1, wherein the first patterned passivation layer is a bi-layer lamination.

5. The method of claim 4, wherein the bi-layer lamination comprises a tetraethylorthosilicate (TEOS) layer and a silicon nitride (SiN) layer.

6. The method of claim 4, wherein a thickness of the first patterned passivation layer is between 7000 angstroms (Å) and 13000 Å.

7. The method of claim 1, wherein the second patterned passivation layer comprises a SiN layer.

8. The method of claim 1, wherein a thickness of the second patterned passivation layer is between 20000 Å and 150000 Å.

9. The method of claim 1, wherein the first openings and the third openings are round openings.

10. A passivation structure formed on a chip comprising:
    a first patterned passivation layer formed on the chip having a plurality of metal pads, the first patterned passivation layer comprising a plurality of first round openings respectively exposing the metal pads; and
    a second patterned passivation layer formed on the first patterned passivation layer, the second patterned passivation layer comprising a plurality of second round openings respectively corresponding to the first openings.

11. The passivation structure of claim 10, wherein the first patterned passivation layer is a bi-layer lamination.

12. The passivation structure of claim 11, wherein the bi-layer comprises a TEOS layer and a SiN layer.

13. The passivation structure of claim 10, wherein the second patterned passivation layer comprises a SiN layer.

14. The passivation structure of claim 13, wherein a thickness of the second patterned passivation layer is between 20000 Å and 150000 Å.

15. A passivation structure formed on a chip having at least a main die region and a scribe line region defined thereon, and a plurality of metal pads respectively positioned in the main die region and the scribe line region, the passivation structure comprising:
    a first patterned passivation layer formed on the chip, the first patterned passivation layer comprising a plurality of first openings and second openings exposing the metal pads respectively in the main die region and the scribe line region; and
    a second patterned passivation layer filling the second openings in the scribe line region on the first patterned passivation layer, the second patterned passivation layer comprising a plurality of third openings respectively corresponding to the first opening in the main die region.

16. The passivation structure of claim 15, wherein the first patterned passivation layer is a bi-layer lamination.

17. The passivation structure of claim 16, wherein the bi-layer lamination comprises a TEOS layer and a SiN layer.

18. The passivation structure of claim 15, wherein the second patterned passivation layer comprises a SiN layer.

19. The passivation structure of claim 18, wherein a thickness of the second patterned passivation layer is between 20000 Å and 150000 Å.

20. The passivation structure of claim 15, wherein the third openings and the first openings are round openings.

* * * * *